US006649524B2

(12) United States Patent
Watanabe

(10) Patent No.: US 6,649,524 B2
(45) Date of Patent: Nov. 18, 2003

(54) METHOD AND APPARATUS FOR FORMING GLASS LAYER, METHOD AND APPARATUS FOR FORMING METAL LAYER, AND ELECTRONIC COMPONENT MANUFACTURING METHOD

(75) Inventor: Shizuharu Watanabe, Omihachiman (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/728,707

(22) Filed: Dec. 1, 2000

(65) Prior Publication Data

US 2001/0009692 A1 Jul. 26, 2001

(30) Foreign Application Priority Data

Dec. 14, 1999 (JP) .......................................... 11-355102
Apr. 27, 2000 (JP) ...................................... 2000-128370

(51) Int. Cl.$^7$ .......................... H01L 21/461; B05D 5/12
(52) U.S. Cl. .................... 438/693; 438/669; 427/126.2; 427/376.2; 427/383.3
(58) Field of Search ................................ 438/693, 669, 438/228; 427/126.2, 402, 180, 240, 241, 372.2, 376.1, 376.2, 383.1, 383.3, 397.7, 397.8, 444; 118/318, 620

(56) References Cited

U.S. PATENT DOCUMENTS 4,992,772 A * 2/1991 Kubota et al. .............. 338/308
5,100,683 A * 3/1992 Singer et al. ............... 426/302
5,324,544 A * 6/1994 Spence et al. ........... 427/397.7
5,798,469 A * 8/1998 Nufer .......................... 75/246
5,914,358 A * 6/1999 Kawakita et al. ........... 523/458
5,919,418 A * 7/1999 Kendall et al. ............... 422/28
6,365,265 B1 * 4/2002 Tose et al. .................. 428/210

FOREIGN PATENT DOCUMENTS

JP 2164782 * 6/1990
JP 8-222411 8/1996

* cited by examiner

*Primary Examiner*—Michael Trinh
*Assistant Examiner*—Pamela Perkins
(74) *Attorney, Agent, or Firm*—Keating & Bennett, LLP

(57) ABSTRACT

Methods and apparatuses for efficiently forming a homogeneous glass layer having uniform thickness and a homogeneous metal layer having uniform thickness are provided. A workpiece is accommodated in a screened container which is rotatable in a predetermined direction. The workpiece in the container is sprayed with an atomized glass slurry or an atomized metal slurry while the container is rotated in order to form a green glass layer or a green metal layer on the workpiece. Simultaneously, hot air is supplied to the workpiece so as to dry the green glass layer or the green metal layer. Thus, the workpiece, typically a ferrite core, can be provided with a homogeneous layer having a uniform thickness. A method for manufacturing an electronic component using the above-described methods and apparatuses is also provided.

15 Claims, 3 Drawing Sheets

METHOD AND APPARATUS FOR FORMING GLASS LAYER, METHOD AND APPARATUS FOR FORMING METAL LAYER, AND ELECTRONIC COMPONENT MANUFACTURING METHOD

BACKGROUND OF THE INVENTION

1. Field of the Invention

The present invention relates to a method and an apparatus for forming a glass layer on the surface of a workpiece, a method and an apparatus for forming a metal layer on the surface of a workpiece, and an electronic component manufacturing method.

2. Description of the Related Art

Generally, electronic components such as chip-type coils, in which spiral conductive patterns are provided on ferrite cores, are provided with glass layers thereon as a protective coating prior to forming conductive patterns thereon. Such electronic components have enhanced environmental resistance and insulation performance, and are protected from the penetration of plating solutions when the electronic component is being plated.

Conventionally, in order to provide a glass layer on a ferrite core, (1) a method in which a glass layer is provided by immersing a ferrite core into a glass paste (or a glass slurry) composed of a glass powder, a binder resin, and a solvent, and firing the ferrite core, (2) a method in which a glass layer is provided by applying a glass paste onto the ferrite core by screen printing and firing the ferrite core, and other similar methods are known in the art.

To form a conductive pattern on a ferrite core, (3) a method in which a conductive pattern is formed by providing a metal layer pattern on a ferrite core by screen-printing a conductive paste including a metal powder, and firing the ferrite core, (4) a method in which a conductive pattern is formed by drying a green metal layer obtained by immersing the ferrite core in a conductive paste including a metal powder and/or glass powder, firing the green metal layer, and patterning the fired metal layer, (5) a method in which a conductive pattern is provided by forming a metal layer via electroless plating and patterning the metal layer, and other similar methods are known in the art.

As for the conventional methods of forming a glass layer on a ferrite core, in method (1), it is difficult to provide a glass layer having a uniform thickness on the surface of the ferrite core, and, in addition, a glass layer cannot be formed on the portion of the surface which is blocked by the ferrite core holder. In method (2), since screen-printing must be performed on each surface of the ferrite core, the screen-printing step must be performed multiple times, resulting in reduced productivity and increased costs. When the surface of the ferrite core has irregularities, it is difficult to form a glass layer having a uniform thickness thereon.

Japanese Patent Unexamined Application Publication No. 8-222411 discloses a method for forming a glass layer on the surface of a workpiece such as a ferrite core. The method includes the steps of preparing glass granules by adding a binder resin to a glass powder and heat-treating the glass granules together with chip-type workpieces (basic electronic components) while mixing the granules and the workpieces in a rotating thermostable container.

However, in this method, when the glass powder has high viscosity or when a crystallized glass powder is used as a glass powder, it becomes difficult to uniformly mix the workpieces and the granules, and, consequently, the thickness of the glass layers is likely to be non-uniform. Furthermore, the workpieces may clump and stick to the inner wall of the container, decreasing the manufacturing efficiency.

As for the conventional methods for forming a conductive pattern on a ferrite core, in method (3), since the screen-printing must be performed on each surface of the ferrite core, the screen-printing is performed a number of times, resulting in reduced productivity and increased costs. Also, when the surface of the ferrite core has irregularities, it is difficult to form a metal layer having a uniform thickness thereon. In method (4), it is difficult to form a green metal layer having uniform thickness on the surface of the ferrite core, and the green metal layer cannot be formed on the portion of the surface which is blocked by the ferrite core holder.

In method (5), the surface of the ferrite core needs to be pretreated, and it is generally difficult to form a thick layer thereon. Furthermore, because plating solutions are used, the problem of effluent disposal exists, and reliability of the product is reduced due to the penetration of the plating solutions.

SUMMARY OF THE INVENTION

To overcome the above-described problems, preferred embodiments of the present invention provide a method and an apparatus in which a homogeneous glass layer of uniform thickness is efficiently formed on the surface of a workpiece, such as a ferrite core. Another preferred embodiment of the present invention provides a method of manufacturing an electronic component having a homogeneous glass layer of uniform thickness provided on the surface thereof and which exhibits superior environmental resistance and superior insulation performance.

Still another preferred embodiment of the present invention provides a method and an apparatus in which a homogeneous metal layer of uniform thickness is efficiently formed on the surface of a workpiece such as a ferrite core.

Yet another preferred embodiment of the present invention provides a method of manufacturing an electronic component, the electronic component in which a homogeneous metal layer of uniform thickness is formed on the surface thereof and which is highly reliable.

A method for forming a glass layer according to the first preferred embodiment of the present invention includes the steps of placing a workpiece in a rotatable container, spraying a glass slurry onto the workpiece to form a green glass layer on the surface of the workpiece while rotating the container, and heating the workpiece in the rotating container so as to dry the green glass layer.

By using this method, a homogeneous glass layer having a uniform thickness is efficiently formed on the surface of the workpiece.

According to the second preferred embodiment of the present invention, an apparatus for forming a glass layer includes a rotatable container, a slurry discharger for spraying a glass slurry onto a workpiece disposed in the container to form a green glass layer on the surface of the workpiece, and a heating unit for heating the workpiece so as to dry the green glass layer formed thereon.

By using this apparatus, consistency in the above-described method for forming a glass layer according to the first preferred embodiment of the invention is greatly enhanced.

According to the third preferred embodiment of the present invention, a method for manufacturing an electronic component (hereinafter referred to as the “first electronic component manufacturing method”) is provided in which a glass layer is formed on a basic electronic component by using the method for forming a glass layer according to the first preferred embodiment of the present invention.

By using this manufacturing method, an electronic component which has a homogeneous glass layer of uniform thickness on the surface thereof and which exhibits superior environment resistance and insulation performance is efficiently manufactured.

According to the fourth preferred embodiment of the present invention, a method for forming a metal layer includes the steps of placing a workpiece in a rotatable container, spraying a metal slurry onto the workpiece to form a green metal layer on the surface of the workpiece while rotating the container, and heating the workpiece in the rotating container so as to dry the green metal layer.

By using this method, a homogeneous metal layer of uniform thickness is efficiently formed on the surface of the workpiece.

According to the fifth preferred embodiment of the present invention, an apparatus for forming a metal layer includes a rotatable container, a slurry discharger for spraying a metal slurry onto a workpiece disposed in the container to form a green metal layer on the surface of the workpiece, and a heating unit for heating the workpiece so as to dry the green metal layer.

By using this apparatus, consistency in the above-described method for forming a metal layer according to the fourth preferred embodiment of the invention is greatly enhanced.

According to a sixth preferred embodiment of the present invention, a method of manufacturing an electronic component (hereinafter referred to as the “second electronic component manufacturing method”) is provided, in which a metal layer is formed on a basic electronic component by the method of forming a metal layer according to the fourth preferred embodiment of the present invention.

By using this manufacturing method, an electronic component which has a homogeneous metal layer of uniform thickness on the surface thereof and which is highly reliable is efficiently manufactured.

Other features, elements, characteristics and advantages of present invention will become apparent from the following detailed description of preferred embodiments thereof with reference to the attached drawings.

DETAILED DESCRIPTION OF PREFERRED EMBODIMENTS

Figure 1:
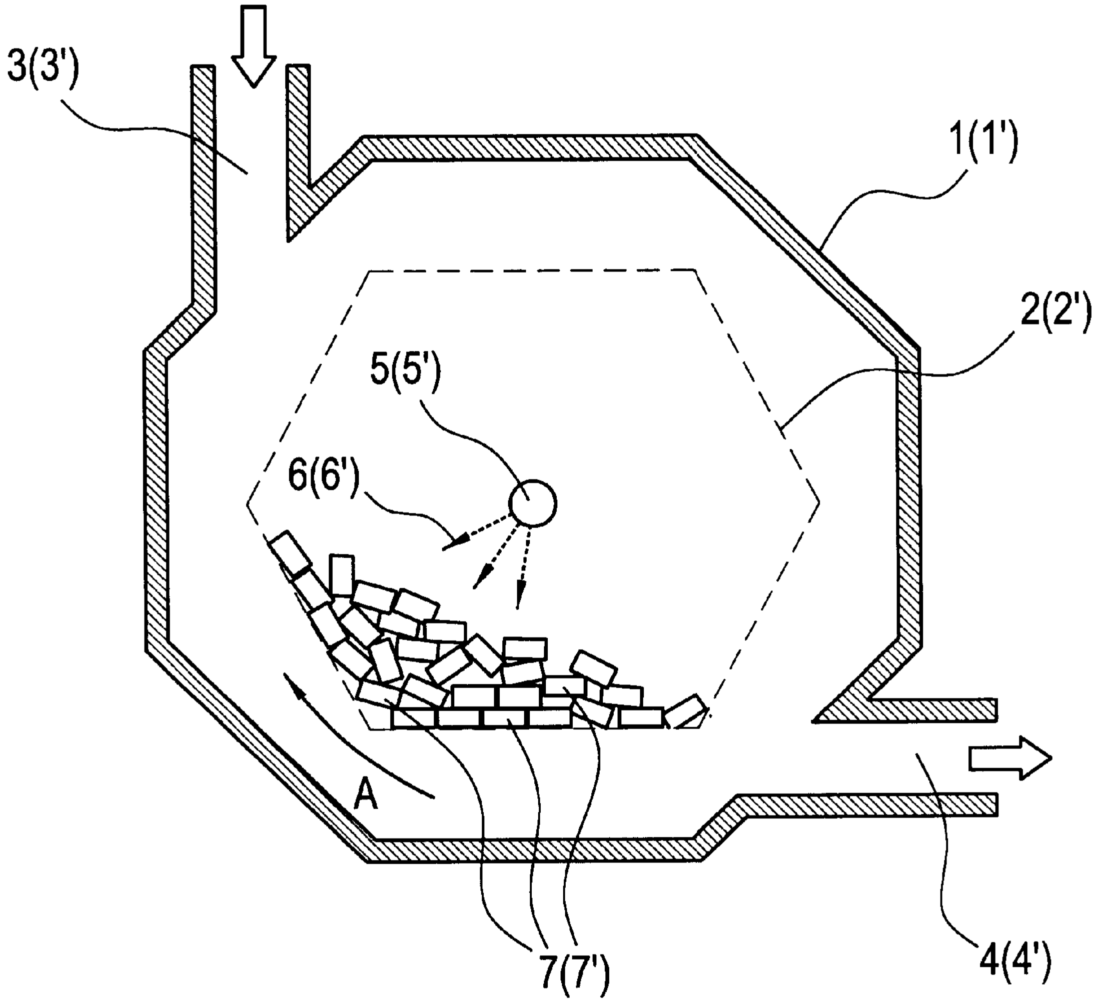
FIG. 1 is a schematic sectional view of a glass-layer forming apparatus (alternatively, a metal-layer forming apparatus) according to one preferred embodiment of the present invention.

First, a method for forming a glass layer on a workpiece will be explained.

A method for forming a glass layer on a workpiece according to one preferred embodiment of the present invention preferably includes (A) a first step of placing a workpiece such as a ferrite core in a rotatable container, (B) a second step of spraying a glass slurry onto the workpiece while rotating the container to form a green glass layer on the surface of the workpiece, and (C) a third step of heating the workpiece so as to dry the green glass layer.

Since the green glass layer is formed by spraying the glass slurry onto the workpiece while rotating the container, a homogeneous green glass layer of uniform thickness is produced. Furthermore, because the green glass layer is dried by heating the workpiece in the rotating container to evaporate the solvent, etc., contained in the green glass layer, clumping of the workpieces is prevented and a green glass layer of superior quality is produced. When a plurality of workpieces are placed in the container, high-quality glass layers are efficiently and simultaneously formed on the plurality of workpieces.

In the glass layer forming method of the present invention, it is to be understood that the workpiece is not limited to a ferrite core. The method is applicable to other chip-type electronic components such as a chip-type varistor and a chip-type thermistor, which require protective and insulating coatings. A crystallized glass powder or amorphous glass powder such as lead borosilicate glass, bismuth borosilicate glass, and zinc borosilicate glass can be used as a glass contained in the glass slurry.

Furthermore, it is preferable that the above-described second and third steps be performed simultaneously. More particularly, the steps of spraying the glass slurry onto the workpiece and heating the workpiece are performed simultaneously so that the solvent are suitably evaporated from the green glass layer formed on the surface of the workpiece. Thus, the thickness of the green glass layer is increased in a uniform manner and a green glass layer having a thickness of, for example, about 5 $\mu$m to about 100 $\mu$m, and having superior quality is obtained.

A screen-type container is preferably used as the container. Inside the screen-type container, a slurry discharger is provided so that the atomized glass slurry is sprayed therefrom to form a green glass layer on the surface of the workpiece. Then, the green glass layer is dried by hot air supplied from a hot air duct disposed outside the screen-type container. By using the screen-type container, hot air is uniformly supplied into the container to allow the solvent contained in the green glass layer to suitably evaporate.

The glass slurry includes a glass powder, a binder resin, and a solvent. It is preferable that the ratio of the glass powder to the binder resin be in the range of 80:20 to 25:75 by weight and that the ratio of total content of the glass powder and the binder resin to the solvent be in the range of 70:30 to 20:80 by weight.

When the amount of the binder resin is less than about 20 percent by weight relative to the glass powder, the green glass layer which coats the workpiece has low strength, and, accordingly, the green glass layer may separate. When the amount of the binder resin exceeds approximately 75 percent by weight relative to the glass powder, the workpieces may clump, and it becomes difficult to form a homogeneous glass layer of uniform thickness. When the amount of the solvent is less than about 30 percent by weight relative to the total amount of the glass powder and the binder resin, the viscosity of the glass slurry becomes too high, resulting in clumping of the workpieces. When the amount of the solvent exceeds about 80 percent by weight relative to the total amount of the glass powder and the binder resin, the amount of the glass powder contained in the glass slurry is relatively low, and it is difficult to obtain a layer having uniform and sufficient thickness. It requires a significant amount of time to obtain a layer of sufficient thickness, and productivity is substantially reduced.

Preferably, the droplets of the atomized glass slurry are about 0.5 μm to about 100 μm in diameter. Droplets of this size produce a homogeneous glass layer of uniform thickness on a large number of workpieces. Preferably, an average grain diameter ($D_{50}$) of the glass powder is in the range of about 0.1 μm to about 10 μm. By using the glass powder of the aforementioned average grain diameter and by spraying the droplets having the above-described size, a homogeneous glass layer of uniform thickness, the thickness being, for example, about 5 μm to about 100 μm or about 10 μm to about 50 μm, are produced. The viscosity of the glass slurry is preferably about 0.01 Pa·s to about 10 Pa·s in order to form a homogeneous glass layer of uniform thickness.

Preferably, the dried green glass layer is fired at a temperature greater than the softening point of the glass to form a glass layer. By firing at a temperature higher than the softening point of the glass, a glass layer is produced which has high strength and high density on the surface of the workpiece. Furthermore, an electronic component is provided with an insulating protective coating, the electronic component exhibiting superior environment resistance and insulating performance.

A predetermined conductive pattern is formed on the resulting glass layer. The conductive pattern is preferably formed by screen-printing. The conductive pattern may also be formed by performing electroless plating on the entire surface of the glass layer and then patterning by laser processing or by using photolithography method. The conductive pattern is preferably formed by patterning the metal layer obtained by the metal layer forming method of the present invention. The metal layer may be patterned by laser processing, photolithography, or other suitable processes.

Next, a method for forming a metal layer on a workpiece will be explained.

The method for forming a metal layer includes (A) a first step of placing a workpiece in a rotatable container, (B) a second step of spraying metal slurry to form a green metal layer on the surface of the workpiece while rotating the container, and (C) a third step of heating the workpiece in the rotating container so as to dry the green metal layer.

As in the glass layer forming method described above, since the green metal layer is formed by spraying the metal slurry onto the workpiece in the rotating container, the green metal layer formed thereby is uniform and homogeneous. Furthermore, because the green metal layer is dried by heating the workpiece in the rotating container to evaporate the solvents, etc., contained in the green metal layer, the clumping of the workpieces can be avoided and a high quality metal layer is formed. When a plurality of workpieces are disposed in the container, high-quality metal layers are efficiently formed on the plurality of workpieces simultaneously.

In the metal layer forming method of the present invention, it is to be understood that the workpiece is not limited to a ferrite core, and the method is applicable to other chip-type components such as a chip-type dielectric resonator, chip-type varistor and chip-type thermistor, in which an electrode layer is formed on the surface thereof.

In the metal layer forming method of various preferred embodiments of the present invention, it is preferable that the above-described second and third steps be carried out simultaneously. More particularly, the spraying of metal slurry on the workpiece and the heating of the workpiece are carried out at the same time so as to allow the solvent to suitably evaporate from the green metal layer formed on the surface of the workpiece. In this manner, a high-quality metal layer having a thickness of about 1 μm to about 50 μm is obtained.

A screen-type container may be used as the container. The green metal layer may be formed on the surface of the workpiece by spraying an atomized metal slurry from a slurry discharger provided inside of the screen-type container. It is preferable that the green metal layer be dried by hot air supplied from a hot air duct provided outside of the screen-type container. By using the screen-type container, hot air is uniformly supplied into the container so as to allow the solvent compositions contained in the green metal layer to evaporate smoothly.

The metal slurry preferably includes a metal powder, a glass powder, a binder resin, and solvent. For the metal powder, Ag, Pt, Pd, Au, Cu, Ni, W, Mo, or other suitable material, the mixture thereof, alloys thereof, etc., is preferably used. For the glass powder, types of glass which are commonly used in thick film conductor pastes, such as lead borosilicate glass, bismuth borosilicate glass, zinc borosilicate glass, or other suitable materials, and metallic oxides having so-called "chemical bonds", such as $Cr_2O_3$, $MnO_2$, CuO, $Cu_2O$ can be used.

The ratio of the metal powder and glass powder in total relative to the binder resin contained in the metal slurry is preferably in the range of approximately 80:20 to approximately 25:75 on a weight basis, and the ratio of the metal powder, glass powder, and the binder resin in total to the solvent is preferably in the range of approximately 70:30 to approximately 20:80 on a weight basis.

When the amount of the binder resin is less than about 20 percent by weight relative to the total amount of the metal powder and the glass powder, the green metal layer which coats the workpiece has low strength, and accordingly, the green metal layer may separate. When the amount of the binder resin exceeds about 75 percent by weight relative to the total amount of the metal powder and the glass powder, the workpieces may clump, and it is difficult to form a uniform and homogeneous metal layer. When the amount of the solvent relative to the glass powder, the metal powder, and binder resin in total is less than about 30 percent by weight, the viscosity of the metal slurry is too high, resulting in clumping of the workpieces. When the amount of the solvent relative to the total amount of metal powder, glass powder, and binder resin exceeds about 80 percent by weight, the amount of metal powder contained in the metal slurry is relatively low, and the conductivity of the obtained metal layer is greatly reduced.

Preferably, the ratio of the metal powder to glass powder in the metal slurry is in the range of approximately 99:1 to approximately 60:40 on a weight basis. When the amount of the glass powder relative to the metal powder is less than about 1 percent by weight, the bonding strength between the green metal layer and the workpiece is reduced, and the metal layer may separate. When the amount of the glass powder exceeds about 40 percent by weight, resistivity of the obtained metal layer is increased and soldering characteristics may be degraded.

Preferably, the droplets of the atomized metal slurry are approximately 0.5 μm to about 100 μm in diameter. Droplets of this size efficiently form uniform and homogeneous metal layers on a large number of workpieces. Preferably, the average grain diameter ($D_{50}$) of the metal powder is in the range of about 0.1 μm to about 10 μm. Uniform and homogeneous metal layers of, for example, about 1 μm to about 50 μm or about 5 μm to about 20 μm can be formed by using a metal powder having the above average particle diameters and by spraying droplets having the above-described sizes. The viscosity of the metal slurry is preferably about 0.01 Pa·s to about 10 Pa·s in order to form a uniform and homogeneous green metal layer. When a glass powder is contained in the metal slurry, the average particle size of the glass powder is preferably about 0.1 μm to about 5 μm.

When the metal slurry contains the glass powder, the metal layer is preferably formed by firing the dried green glass layer at a temperature higher than the softening point of the glass. In this manner, a metal layer having greatly increased strength and density is formed on the surface of the workpiece, and highly reliable electronic components are obtained.

The resulting metal layer can be patterned into any desired conductor shape. The patterning may be performed by laser processing or by photolithography. The surface portion of the workpiece where the formation of the metal layer is not desired may be pretreated so that the metal slurry will not adhere to that portion of the surface.

Next, an apparatus for forming a glass layer according to various preferred embodiments of the present invention will be explained with reference to additional preferred embodiments.

A glass layer forming apparatus shown in FIG. 1, preferably includes an outer container 1 having a hot air duct 3 which functions as a hot air supplier and an exhaust duct 4, and a container 2 capable of accommodating a plurality of workpieces 7. The container 2 rotates in the direction indicated by arrow A in FIG. 1, and is made of wire screen so that hot air may be supplied from the outside of the container 2 to the workpieces 7. A nozzle 5 which functions as a glass slurry discharger is provided at the approximate center portion of the container 2. The nozzle 5 is arranged so that an atomized glass slurry 6 is sprayed onto the workpieces 7.

By using the above-described glass layer forming apparatus, a plurality of workpieces 7 are evenly tumbled in the rotating container 2, and the steps of spraying the atomized glass slurry 6 onto the workpieces 7 and drying the green glass layer are performed simultaneously. Thus, the workpieces are prevented from clumping and homogeneous green glass layers having uniform thickness are formed on the workpieces 7. Since a plurality of the workpieces 7 are accommodated in the container 2, a large number of workpieces coated with glass layers are manufactured simultaneously.

More particularly, since the container 2 is a screen-type container and has the nozzle 5 functioning as a glass slurry discharger inside and the hot air duct 3 delivers hot air to the workpieces 7 contained in the container 2 from the outside of the container 2, the amount of the glass slurry spray is easily controlled and a large number of workpieces 7 are provided with uniform and homogeneous green glass layers. The step of heating the workpieces is performed in a uniform manner, and the green glass layer is suitably dried.

The metal layer forming apparatus of the present preferred embodiment of the present invention has substantially the same construction as that of the above-described glass layer forming apparatus.

More particularly, the metal layer forming apparatus shown in FIG. 1 preferably includes an outer container 1' having a hot air duct 3' which functions as a hot air supplier and an exhaust duct 4', and a container 2' capable of accommodating a plurality of workpieces 7'. The container 2' is rotatable in the direction indicated by arrow A in FIG. 1 and is made of wire screen so that hot air may be delivered to the workpieces 7' from outside the container 2. A nozzle 5' which functions as a metal slurry discharger is provided in the approximate center portion of the container 2'. The nozzle 5 is arranged so that an atomized metal slurry 6' is sprayed onto the workpieces 7'.

In this metal layer forming apparatus, the plurality of workpieces 7' are evenly tumbled in the rotating container 2'. The step of spraying the atomized metal slurry to the workpieces 7' and the step of drying the green metal layer are performed simultaneously so that the workpieces do not clump and so that homogeneous metal layers of uniform thickness are formed on the surface of the workpiece 7'. Since a plurality of workpieces 7' are placed in the container 2', a large number workpieces coated with metal may be formed simultaneously.

More particularly, since the container 2' is a screen-type container and has the nozzle 5' functioning as a metal slurry discharger inside and the hot air duct 3' delivers hot air to the workpieces 7' inside the container 2' from the outside of the container 2', the amount of the metal slurry spray is easily controlled and a large number of workpieces 7' are provided with uniform and homogeneous green metal layers. Heating of the workpieces is performed in an even manner, and the green metal layers are suitably dried.

Next, the method of forming a glass layer and a metal layer on a ferrite core using the glass layer forming apparatus (and the metal layer forming apparatus) shown in FIG. 1 will be explained in detail with reference to the drawings.

Figure 2A:
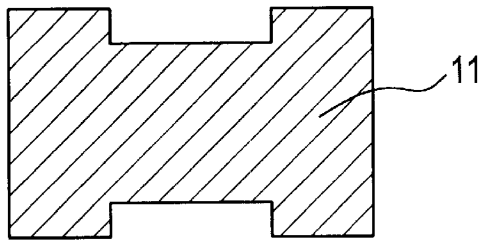
FIGS. 2A to 2D are schematic sectional views illustrating a process for applying a glass layer on a ferrite core and a process for applying a metal layer on a glass layer on a ferrite core.
Figure 2B:
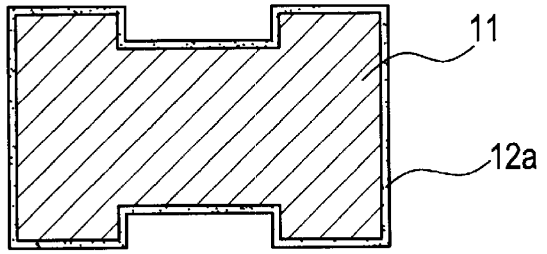

First, a plurality of ferrite cores 11, an example of which is shown in FIG. 2A, are prepared and are placed in the screen-type container 2 of the glass layer forming apparatus. The container 2 is rotated in the direction indicated by arrow A in FIG. 1, and the spray of glass slurry 6 is discharged from the nozzle 5 while the workpieces 7 (ferrite cores 11, in this case) are tumbled by the rotation. Hot air is delivered from the hot air duct 3. These conditions are maintained for a predetermined period of time. A green glass layer **12*a* is formed on the ferrite core 11 as shown in FIG. 2B. It is to be noted that the glass slurry 6 preferably includes a slurry substance in which a glass powder is mixed and dispersed in a binder resin and solvent. Then the ferrite core having a green glass layer 12*a* is removed and the green glass layer 12*a* is fired at a temperature higher than the softening point of the green glass layer 12*a*. Thus, the ferrite core 11 having a glass layer 12*b*** is formed.

Figure 2C:
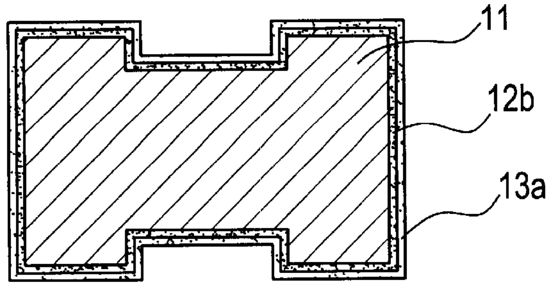

The ferrite core 11 coated with a glass layer **12*b* is then placed in the screen-type container 2' of the metal layer forming apparatus. The container 21 is rotated in the direction indicated by arrow A in FIG. 1, and the spray of metal slurry 6' is discharged from the nozzle 5' while the workpieces 7' (i.e., the ferrite cores 11 with glass layers 12*b* in this case) are tumbled by the rotation. Hot air is delivered from the hot air duct 3' and these conditions are maintained for a predetermined period of time. A green metal layer 13*a* is formed on the glass layer 12*b* as shown in FIG. 2C. The ferrite core 11 coated with the green metal layer 13***a* is removed and the green metal layer 13*a* is fired at a temperature higher than the softening point of the glass contained in the green metal layer 13*a*. Thus, the ferrite core 11 having a glass layer 12*b* and a metal layer thereon is formed.

Figure 2D:
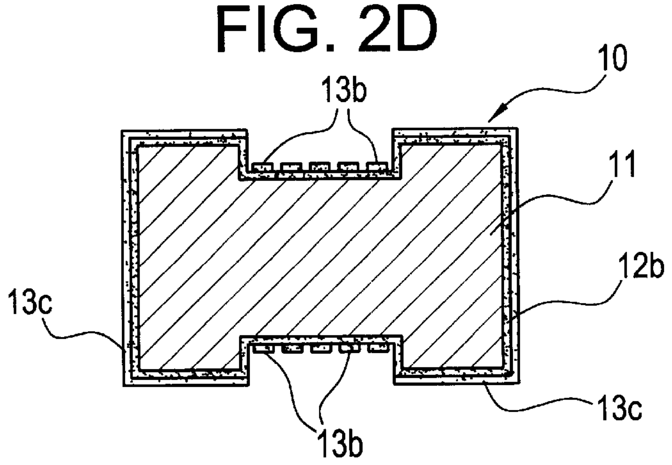
Figure 3:
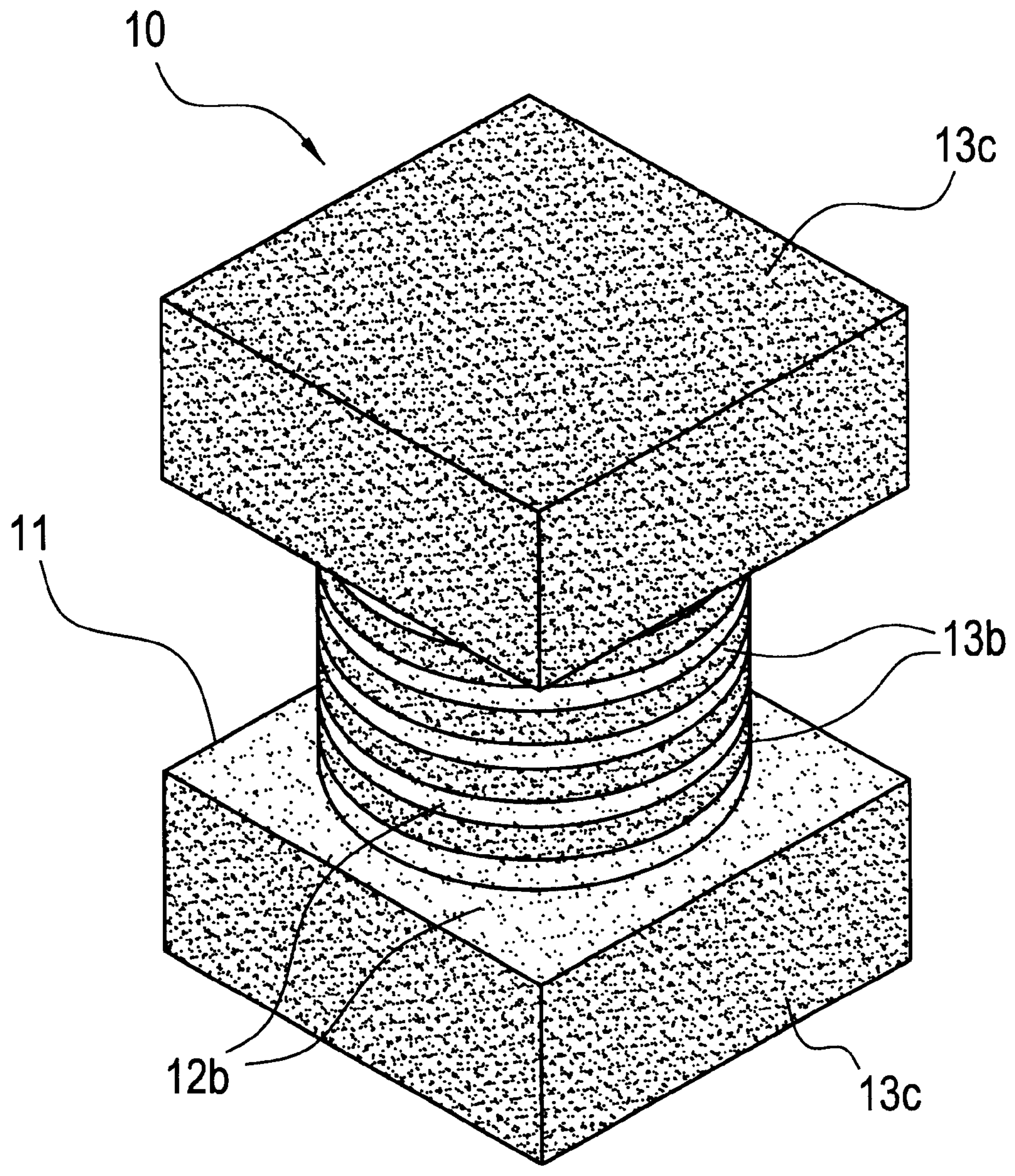
FIG. 3 is a schematic isometric view of the ferrite core shown in FIG. 2D.

Then, the metal layer is patterned by laser processing. A chip-type coil 10 having a spiral conductive pattern 13*b* and end electrodes 13*c* on the surface of the glass layer 12*b* provided on the ferrite core 11 as shown in FIGS. 2D and 3 is prepared.

Although the electronic component manufacturing method of the present invention has been described in relation to a ferrite core and to the formation of a glass layer and a metal layer thereon, the above description does not limit the scope of the invention to the above-described preferred embodiments.

For example, the electronic component manufacturing method of the present invention is not only applicable to the manufacturing method for chip-type coil which uses a ferrite core as a basic electronic component, but is also applicable to a method for manufacturing a surface protection layer of the chip-type varistor and to a protection layer for improving the transverse strength, provided on the chip-laminated capacitor. The basic electronic components (or workpieces) placed in the rotating container may be of various different sizes.

Furthermore, after the ferrite core 11 having the green glass layer 12*a* thereon is fired, a metal layer may be formed on the surface of the glass layer 12*b* by electroless plating or other suitable process, and the metal layer may then be patterned by laser etching or by photolithography to form end electrodes and a spiral conductive pattern.

In order to efficiently form homogeneous glass layers of uniform thickness, the composition of the glass slurry, the amount of glass slurry to be sprayed, the temperature of hot air supplied to the container, and the rotation rate of the container are important parameters.

The amount of the glass slurry spray is preferably about 0.5 ml/min to about 10 ml/min. When the amount is less than about 0.5 ml/min, substantial amounts of time are required to form the green glass layer. When the amount exceeds about 10 ml/min, the workpieces may clump. The temperature of hot air supplied into the container is preferably in the range of the boiling point of the solvent contained in the glass slurry is about ±50° C. When typical organic solvents are used, the temperature is preferably in the range of about 40° C. to about 80° C., and when typical aqueous solvents are used, the temperature is preferably in the range of about 80° C. to about 120° C. As for the rotation rate of the container, about 10 rpm to about 50 rpm is preferred. When the rotation rate is less than about 10 rpm, the workpieces are likely to clump and when the rotation rate exceeds about 50 rpm, perforations and cracks may occur in the green glass layer. The rotation rate may be constant or varied. It is to be understood that in the present invention, the word "rotate" is meant to include rocking motions.

The amount of the metal slurry spray is preferably about 0.5 ml/min to about 10 ml/min. When the amount is less than about 0.5 ml/min, substantial amounts of time are required to form the green metal layer. When the amount exceeds about 10 ml/min, the workpieces may clump. The temperature of the hot air delivered to the container is preferably between the boiling point of the solvent contained in the metal slurry is about ±50° C. When typical organic solvents are used, the temperature is preferably about 40° C. to about 80° C., and when typical aqueous solvents are used, the temperature is preferably about 80° C. to about 120° C. As for the rotation rate of the container, about 10 rpm to about 50 rpm is preferred. When the rotation rate is less than about 10 rpm, the workpieces may frequently clump and when the rotation rate exceeds about 50 rpm, perforations and cracks may occur in the green metal layer.

These parameters may vary in accordance with the type and number of workpieces, composition of the glass slurry and the metal slurry, the size of the container, and so forth, and are not limited to the above-described values. The amount of the glass slurry spray and metal slurry spray, the temperature of hot air delivered in the container, etc., may be kept constant or may be varied while the glass layer (or the metal layer) is being formed on the workpiece, depending on the thickness of the glass layer (or the metal layer) and drying performance.

The shape of the container need not be hexagonal as shown in FIG. 1. Any shape capable of tumbling the plurality of workpieces in a uniform manner may be used. The shape may be polygonal or substantially circular. When using a substantially circular container, it is preferable that a plurality of baffle plates be formed on the inner wall thereof in order to tumble the workpieces evenly.

The glass slurry mainly includes a glass powder, a binder resin, and solvent. In some cases, a ceramic filler such as alumina or zirconia, or other additives may be added. Similarly, a ceramic filler such as alumina or zirconia, or other additives, may be added to the metal slurry. In particular, regarding the metal slurry, it is preferable that a glass powder having the same composition as that of the glass layer which lies under the metal layer be added to the metal slurry so as to improve the bonding strength.

EXAMPLES

Next, preferred embodiments of the present invention will be described by way of examples.

EXAMPLE 1

First, a borosilicate glass powder having an average particle diameter of about 0.5 μm to about 20 μm was prepared. A butyral-based resin and an organic solvent were added to the glass powder at weight ratios of the glass powder to the resin shown in Table 1 and at weight ratios of the glass powder and resin in total to the solvent shown in Table 1. Then the mixture was mixed in a ball mill for 16 hours. The organic solvent composed of a mixture of toluene and ethanol at a weight ratio of 1:1 was used in this example.

Then, a green glass layer was formed on each surface of 700 grams of ferrite cores (each ferrite core having a size of 1.0 mm×1.0 mm×2.0 mm and a weight of 0.01 grams) by using the above-described glass layer forming apparatus. The rotation rate of the container was about 25 rpm and the temperature of the hot air was about 40° C. to about 80° C. The discharge amount of the slurry and coating time was suitably controlled. A screened container made of stainless steel of about 30 cm in depth and about 30 cm in diameter was used as container.

The surfaces of the thus-obtained ferrite cores were visually observed to determine the conditions of the green glass layers. The ferrite cores with green glass layers were then fired at a temperature of about 850° C., this temperature being higher than the softening point of the borosilicate glass powder, and the coating conditions were again visually observed. The conditions of the glass green layers formed (the coating status) are shown in Table 1. When the green glass layer was coated thereon satisfactorily, the glass layer formed by firing such a glass green layer also had a satisfactory coating.

TABLE 1

| Sample | glass powder/resin (wt. %) | glass powder + resin/solvent (wt. %) | coating conditions |
|---|---|---|---|
| 1 | 85/15 | 60/40 | detached |
| 2 | 80/20 | 60/40 | satisfactory |
| 3 | 75/25 | 60/40 | satisfactory |
| 4 | 65/35 | 50/50 | satisfactory |
| 5 | 50/50 | 40/60 | satisfactory |
| 6 | 25/75 | 30/70 | satisfactory |
| 7 | 20/80 | 40/60 | clumped |
| 8 | 75/25 | 75/25 | clumped |
| 9 | 75/25 | 70/30 | satisfactory |
| 10 | 50/50 | 20/80 | satisfactory |
| 11 | 50/50 | 15/85 | non-uniform |

In Table 1, as shown in Sample 1, when the amount of the binder resin relative to the amount of the glass powder was less than about 20 percent by weight, the strength of the coating was low and separation of the green glass layer was frequently observed. When the amount of the binder resin exceeded about 75 percent by weight, as shown in Sample 7, the ferrite cores clumped, and consequently, uniform coating was not achieved.

As for the amount of the solvent relative to the total amount of the glass powder and the binder resin, as shown in Sample 8, when the amount of the solvent was less than about 30 percent by weight, the viscosity of the slurry was high, causing the ferrite cores to clump. When the amount of the solvent exceeded about 80 percent by weight, as shown in Sample 11, the amount of the glass contained in the glass slurry was reduced, and some of the ferrite cores did not have a uniform coating. Furthermore, the sample slurry required significant amounts of time to obtain the layer of sufficient thickness, and was considered to be impractical.

In Samples 2 to 6, 9, and 10 in which the amount of the binder resin relative to the glass powder was about 20 to about 75 percent by weight and the amount of the solvent relative to the total amount of the glass and the binder resin was about 30 to about 80 percent by weight, perforations and cracks were not observed and homogeneous glass layers having a uniform thickness were formed. The environmental resistance and reliability of the ferrite core were greatly improved.

EXAMPLE 2

First, a metal slurry was prepared as below. An Ag powder having an average particle diameter of about 0.5 $\mu$m to about 10 $\mu$m and a borosilicate glass powder having an average particle diameter of about 0.5 $\mu$m to about 10 $\mu$m were respectively prepared. Then the Ag powder, the borosilicate glass powder, a butyral-based resin, and an organic solvent were mixed so that weight ratios of Ag powder to glass powder, weight ratios of Ag powder and the glass powder in total to the resin, and weight ratios of the Ag powder, the glass powder, and the resin in total to the solvent were set to those shown in Table 2. The mixture was mixed for 16 hours in a ball mill. The organic solvent composed of a mixture of toluene and ethanol at a weight ratio of 1:1 was used in this example.

Then, by using the metal layer forming apparatus described above, a metal layer was formed on each surface of 700 grams of ferrite cores (each having a size of 1.0 mm×1.0 mm×2.0 mm and a weight of 0.01 grams) coated with the glass layers. In the example, the rotation rate of the container was about 25 rpm and the temperature of hot air was set at about 40° C. to about 80° C. The discharge amount of the slurry and coating time were suitably controlled. A screened container made of stainless steel of about 30 cm in depth and about 30 cm in diameter was used as the container.

The surface of the resultant ferrite cores were visually observed to determine the conditions of the metal green layers formed. The ferrite cores with metal green layer were then fired at a temperature of about 850° C., this temperature being higher than the softening point of the borosilicate glass powder, and the coating conditions were again visually observed. The conditions of the metal green layers formed (the coating conditions) or the conditions of the metal layers formed (asterisked) are shown in Table 2. When the green metal layer was coated thereon satisfactorily, the metal layer formed by firing such a metal green layer also formed a satisfactory coating.

TABLE 2

| Sample | Ag powder/ glass powder (wt. %) | Ag powder + glass powder/ resin (wt. %) | Ag powder + glass powder + resin/solvent (wt. %) | coating condition |
|---|---|---|---|---|
| 12 | 99.5/0.5 | 75/25 | 50/50 | separated after firing* |
| 13 | 99/1 | 50/50 | 30/70 | satisfactory |
| 14 | 90/10 | 80/20 | 60/40 | satisfactory |
| 15 | 60/40 | 65/35 | 50/50 | satisfactory |
| 16 | 58/42 | 65/35 | 20/80 | high resistivity* |
| 17 | 95/5 | 85/15 | 60/40 | separated |
| 18 | 90/10 | 75/25 | 60/40 | satisfactory |
| 19 | 70/30 | 50/50 | 40/60 | satisfactory |
| 20 | 65/32 | 25/75 | 30/70 | satisfactory |
| 21 | 90/10 | 20/80 | 40/60 | clumped |
| 22 | 90/10 | 75/25 | 75/25 | clumped |
| 23 | 90/10 | 75/25 | 70/30 | satisfactory |
| 24 | 90/10 | 50/50 | 20/80 | satisfactory |
| 25 | 90/10 | 50/50 | 15/85 | non-uniform |

As shown in Sample 12 in Table 2, when the amount of the glass powder relative to the amount of the metal powder was less than about 1 percent by weight, though coating was possible, the bond between the metal layer obtained by firing and the glass layer provided on the surface of the ferrite core was weak, and the metal layer separated in some cases. As shown in Sample 16, when the amount of the glass powder exceeds about 40 percent by weight, resistivity at the metal layer was too high, substantially degrading performance as a conductor.

As shown in Sample 17, when the amount of the resin relative to the total amount of the metal powder was less than about 20 percent by weight, the strength of the coating was low and separation of the metal layer was observed in some instances. As shown in Sample 10, when the amount of the resin relative to the total amount of the metal powder and glass powder exceeds about 75 percent by weight, the ferrite cores clumped and it was difficult to obtain a coating having uniform thickness.

As shown in Sample 22, when the amount of the solvent relative to the total amount of the metal powder, the glass powder and the resin was less than about 30 percent by weight, the viscosity of the metal slurry was high, causing the ferrite cores to clump. On the other hand, when the amount of the solvent exceeds about 80 percent by weight as shown in Sample 25, the amount of the metal powder and the glass powder contained in the metal slurry was decreased, and some of the ferrite cores did not have uniform coating.

Furthermore, the sample slurry required a significant amount of time to form a layer of sufficient thickness, and was considered to be impractical.

In Samples 13 to 15, 18 to 20, 23, and 24 in which the amount of the glass powder relative to the metal powder was about 1 to about 40 percent by weight, the amount of the resin relative to the total amount of the metal powder and the glass powder was about 20 to about 75 percent by weight, and the amount of the solvent relative to the total amount of the metal powder, the glass powder, and the resin was about 30 to about 80 percent by weight, perforations and cracks were not observed and a homogeneous metal layer having a uniform thickness were formed. Thus, chip-type coils of high reliability were efficiently manufactured.

While the invention has been particularly shown and described with reference to preferred embodiments, it will be understood by those skilled in the art that the foregoing and other changes in form and details can be made without departing from the spirit and scope of the invention.

What is claimed is:

1. A method for forming a glass layer, comprising the steps of:

placing a workpiece into a rotatable container;

spraying a glass slurry onto the workpiece while rotating the container to form a green glass layer on the surface thereof; and heating the workpiece while rotating the container so as to dry the green glass layer; wherein the glass slurry comprises a glass powder, a binder resin, and a solvent;

the ratio by weight of the glass powder to the binder resin contained in the glass slurry is in the range of approximately 80:20 and approximately 25:70, and the ratio by weight of the glass powder and the binder resin in total to the solvent contained in the glass slurry is in the range of approximately 70:30 to approximately 20:80;

the average grain diameter of said glass powder is in the range of about 0.1 μm to about 10 μm; and the viscosity of said glass slurry is in the range of about 0.01 Pa·s to about 10 Pa·s.

2. A method for forming a glass layer according to claim 1, wherein the step of spraying and heating are performed simultaneously.

3. A method for forming a glass layer according to claim 1, wherein the container comprises a screen-type container, and the green glass layer is formed by spraying the atomized glass slurry onto the surface of the workpiece from a slurry discharger disposed in the screen-type container.

4. A method for forming a glass layer according to claim 3, further comprising the step of supplying hot air through a hot air supplier provided outside of the screen-type container so as to dry the green glass layer.

5. A method for forming a glass layer according to claim 1, wherein the green glass layer is fired at a temperature higher than the softening point of the glass, subsequent to the step of drying the green glass layer.

6. A method for manufacturing an electronic component, wherein a glass layer is formed on a basic electronic component by using the method for forming a glass layer according to claim 1.

7. A method for manufacturing an electronic component according to claim 6, wherein a predetermined conductive pattern is formed on the glass layer.

8. A method for forming a metal layer, comprising the steps of:

placing a workpiece into a rotatable container;

spraying a metal slurry onto the workpiece while rotating the container to form a green metal layer on the surface thereof; and heating the workpiece while rotating the container so as to dry the green metal layer; wherein the metal slurry comprises a metal powder, a glass powder, a binder resin, and a solvent;

the ratio by weight of the metal powder and glass powder in total to the binder resin is in the range of approximately 80:20 approximately 25:75 and the ratio by weight of the metal powder, the glass powder and the binder resin in total to the solvent is in the range of approximately 70:30 to approximately 20:80;

the average grain diameter of said metal powder is in the range of about 0.1 μm to about 10 μm; and the viscosity of said metal slurry is in the range of about 0.01 Pa·s to about 10 Pa·S.

9. A method for forming a metal layer according to claim 8, wherein the steps of spraying and heating are performed simultaneously.

10. A method for forming a metal layer according to claim 8, wherein the container includes a screen-type container, and the green metal layer is formed by spraying the atomized metal slurry onto the surface of the workpiece from a slurry discharger disposed in the screen-type container.

11. A method for forming a metal layer according to claim 10, further comprising the step of supplying hot air through a hot air supplier provided outside of the screen-type container so as to dry the green metal layer.

12. A method for forming a metal layer according to claim 8, wherein the ratio by weight of the metal powder to the glass powder contained in the metal slurry is in the range of approximately 99:1 to approximately 60:40.

13. A method for forming a metal layer according to claim 8, the green metal layer is fired at a temperature higher than the softening point of the glass powder, subsequent to the third step of drying the green metal layer.

14. A method for manufacturing an electronic component, wherein a metal layer is provided on a basic electronic component by using the methods for forming a metal layer according to claim 8.

15. A method for manufacturing an electronic component according to claim 14, wherein a predetermined conductive pattern is formed on the metal layer.

* * * * *